United States Patent [19]

Danzeisen

[11] Patent Number: 5,025,208
[45] Date of Patent: Jun. 18, 1991

[54] METHOD OF MEASURING RADIO-FREQUENCY INTERFERING VOLTAGES

[75] Inventor: Klaus Danzeisen, Gräfelfing, Fed. Rep. of Germany

[73] Assignee: Rohde & Schwarz GmbH & Co KG, Fed. Rep. of Germany

[21] Appl. No.: 346,082

[22] Filed: May 1, 1989

[30] Foreign Application Priority Data

May 21, 1988 [DE] Fed. Rep. of Germany ....... 3817500

[51] Int. Cl.$^5$ .................... G01R 23/16; H04B 17/00
[52] U.S. Cl. .................... 324/77 R; 455/67; 455/115
[58] Field of Search ............ 455/115, 63, 67; 324/77 A, 77 R, 77 E, 81

[56] References Cited

U.S. PATENT DOCUMENTS

| 4,004,227 | 1/1977 | Ikrath | 455/67 |
| 4,119,964 | 10/1978 | Johannsen et al. | 455/67 |
| 4,143,323 | 3/1979 | Cieslak et al. | 455/115 |
| 4,810,960 | 3/1989 | Owen et al. | 455/67 |

FOREIGN PATENT DOCUMENTS 2804867  8/1979  Fed. Rep. of Germany .

OTHER PUBLICATIONS

Track and Hold, Circuit Description, Hewlett-Packard Manuel 8568, pp. 8-223-8-224, 8-234.
C.I.S.P.R. Specification for Radio Interference Measuring Apparatus and Measurements, CISPR (1987).
Milde H., "Messung von Störsignalen" Radio Fetnsehen Elektronik, vol. 21, No. 16, 1972, pp. 534-536.
Coenning F., "Automatic Level Measuring System for Frequencies Between 200 Hz and 100 MHz", Transactions on Instrumentation and Measurement, vol. DM-20, No. 4, 1971, pp. 225-230.

Primary Examiner—Hezron E. Williams
Assistant Examiner—Louis M. Arana
Attorney, Agent, or Firm—Hill, Van Santen, Steadman & Simpson

[57] ABSTRACT

For fast measurement of radio-frequency interference voltages (also called RFI voltages) within a predetermined frequency range in conformity with rating standards, the maximum and minimum peak voltage levels are measured during tuning of the frequency range; when the maximum peak voltage level exceeds a predetermined limit value, the tuning process is interrupted and a quasi-peak measurement is performed at this instantaneous frequency.

4 Claims, 1 Drawing Sheet

METHOD OF MEASURING RADIO-FREQUENCY INTERFERING VOLTAGES

BACKGROUND OF THE INVENTION

1. Field of the Invention

The present is directed to a method of measuring radio-frequency interference voltages (also called RFI voltages) or RFI energy (RFI currents or RFI field strengths) converted to such RFI voltages within a predetermined frequency range.

2. Description of Prior Art

The measurement of RFI energy such as RFI current, RFI power or RFI field strength is defined in conformity with national and international standards (for instance CISPR, VDE and FCC standards) by measuring regulations and limit values. One of these measuring regulations, for example, is peak-voltage measurement in which the peak voltage levels measured while tuning the frequency range are compared with a predetermined so-called broadband limit level. A further measuring regulation is the so-called quasi-peak measurement in which the interference voltages during measurement are rated by predetermined standardized time constants, for instance to CISPR again. Until recently, these different measurements on the EUT (equipment under test) have been performed successively by corresponding tuning through the entire frequency range. The peak-value measurement can be performed relatively quickly since the measuring time per peak value is only about 30 ms, so that the entire frequency band can be tuned within e.g. three minutes. For the quasi-peak measurement, however, the standard prescribes certain charge and discharge time constants with the result that each such quasi-peak measurement takes at least one second. Hence, the measuring period for such a quasi-peak measurement throughout the entire frequency range is more than one hour.

For noise rating in spectral analyzers it is known per se to measure both the maximum and the minimum peak voltage level during continuous tuning of a predetermined frequency range (spectral analyzer HP 8568 of Hewlett-Packard).

SUMMARY OF THE INVENTION

It is the object of the present invention to provide a method of measuring RFI voltages which permits the desired measurements to be performed within an extremely short time.

In accordance with the present invention the specified object is solved by a method of measuring RFI voltages in a predetermined frequency range, which is particularly characterized in that, during tuning of the frequency range, both the maximum and the minimum peak voltage levels are respectively measured, the respective measured maximum peak voltage level is compared with a predetermined limit value and, when the limit value is exceeded, the tuning process is interrupted, and at this instantaneous frequency a quasi-peak measurement is subsequently performed.

According to a particular feature of the invention, with the tuning process interrupted, a quasi-peak measurement is performed only when the maximum and minimum peak voltage levels are different.

According to another feature of the invention, the repetition frequency of the interference signal is determined from the result of the quasi-peak measurement.

According to another feature of the invention, with the tuning process interrupted, the average value of the interference voltage is simultaneously measured.

With the measuring method in accordance with the present invention it is possible to perform and to evaluate RFI voltage measurements on an EUT within an extremely short time. When it is found in this measuring method that the maximum peak voltage currently measured upon frequency range tuning exceeds the limit value set by the standard, the tuning process is interrupted immediately. At the same time the minimum peak voltage level measured and stored during tuning is evaluated and compared with the maximum peak voltage level that causes the interruption. When it is found in the process that both measured values have different magnitudes, the further proposition can be made that the interference signal measured at this frequency is modulated, e.g. by pulse-amplitude modulation. This permits the simultaneous proposition that broadband noise is concerned which produces a noise spectrum of greater or lesser width depending on the modulation mode. Also, this determination of the measured values of different magnitude automatically initiates the quasi-peak measurement of the interference signal, and the interference signal which has already been recognized as broadband noise is then again subjected to quasi-peak measurement by predetermined time constants, for example again to CISPR, so that further detailed information relating to the kind of interference signal can be obtained.

If it is found during such a measuring process after interruption of the tuning operation (when the predetermined limit value is exceeded by the respective measured maximum peak voltage) that maximum peak voltage and minimum peak voltage are equal, it is possible to state that narrowband noise is concerned which does not exhibit any modulation (pure sine-wave signal). In this case a subsequent quasi-peak measurement is generally not required because the value for indication can be obtained without loss of time from the maximum peak voltage level multiplied by a constant (rating-dependent) factor. Under certain circumstances, however, it may be appropriate also in this case to perform additional measurements on this narrowband interference signal with the tuning operation interrupted, for example for calibration purposes.

In the quasi-peak measurement of noise which has been recognized as a modulated interference signal it is especially advantageous to determine additionally the repetition frequency at which the interference signal fluctuates between maximum and minimum peak voltage levels, because the measuring circuits for quasi-peak measurement (for example to CISPR) also indicate via the output voltage the magnitude of the repetition frequency of the rated signal. From these various measured values obtained during tuning and upon interruption, the evaluation circuit proper can therefore provide and possibly indicate various information relating to the kind of interference signal, for instance whether a purely pulse-shaped interference signal, a continuous interference signal, or a composite pulse-shaped continuous interference signal is concerned. With the method according to the present invention the measuring period in which it is found whether or not a given EUT corresponds to the interference limits set by the standard is considerably reduced, because the measurement can be terminated when a presettable number of excessively high measured values is exceeded.

The method of the present invention can very easily be realized with known spectral analyzers of the type specified above, in which the detectors for maximum and minimum peak voltage measurement are already provided in most cases and in which it is possible, moreover, to interrupt continuous tuning of a predetermined broad frequency range in the case of signals which exceed a predetermined limit value. To permit the use of such a spectral analyzer for interference voltage measurement according to the invention it is merely necessary to provide an additional known measuring circuit for quasi-peak measurement in conformity with the desired standard and to provide a control program for the execution of the method of the present invention.

BRIEF DESCRIPTION OF THE DRAWING

Other objects, features and advantages of the invention, its organization, construction and operation will be best understood from the following detailed description taken in conjunction with the accompanying drawing on which.

DESCRIPTION OF THE PREFERRED EMBODIMENTS

Figure 1:
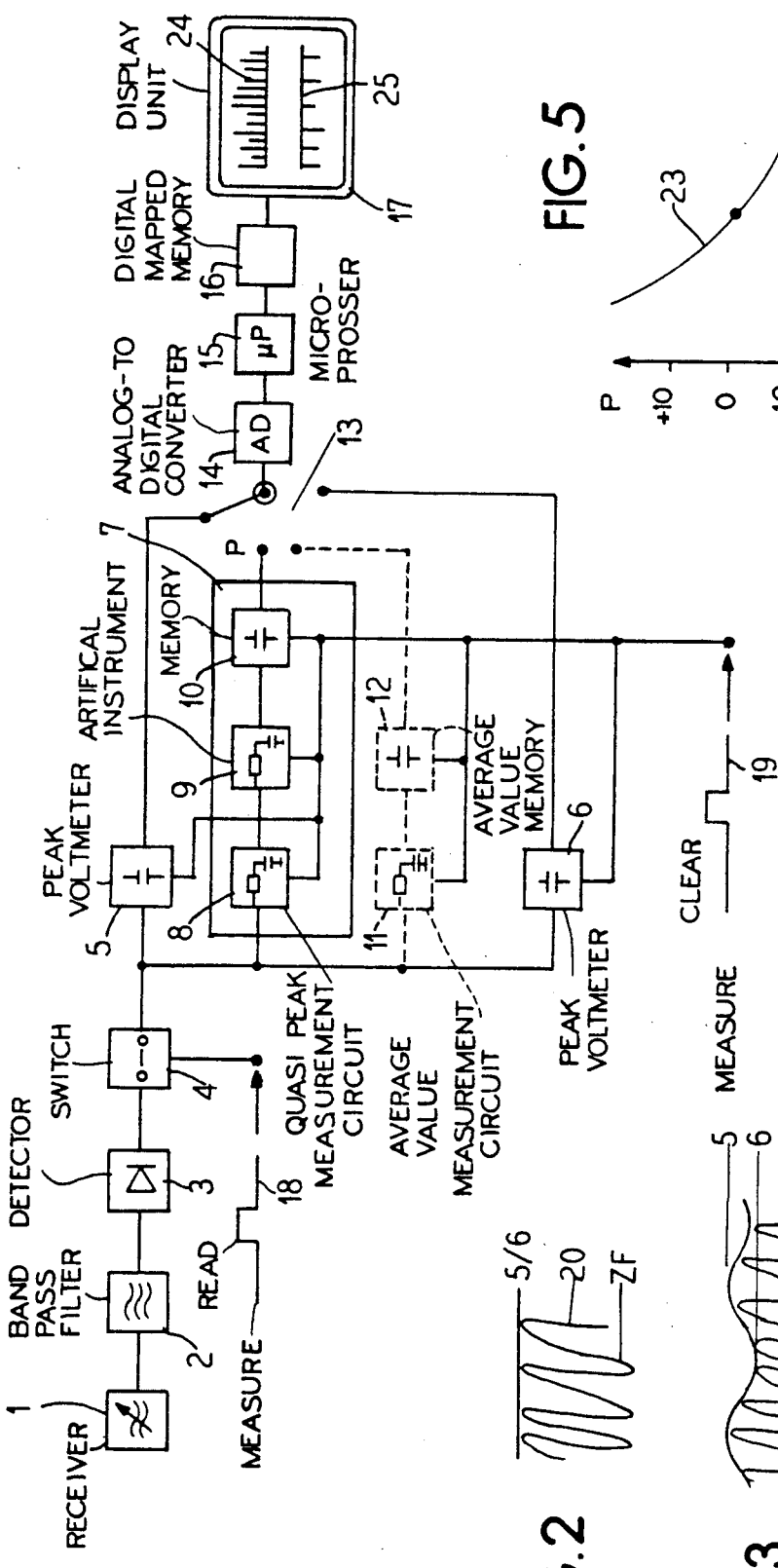
FIG. 1 is a schematic representation of a spectral analyzer supplemented for performing the method of the present invention.

The interference signal to be measured is supplied to the input of the frequency-tunable RF receiver 1, the generated IF signal is passed via a band-pass filter 2 to an envelope detector 3 and via a switch 4 to a peak voltmeter 5. This peak voltmeter 5 is designed for measuring and storing the maximum peak voltage level respectively occurring during tuning of the entire frequency range. Measurement of the respective maximum peak voltage level is effected in the known way during tuning in a time window which is predetermined by the receiver design. During tuning a second peak voltmeter 6 simultaneously measures in said predetermined time window the respective minimum peak voltage level, which is likewise stored. The output signal from the envelope detector 3 is also supplied to a known measuring circuit 7 for quasi-peak measurement, for instance to CISPR. This measuring circuit 7 is composed of the quasi-peak measurement circuit 8 proper, an artificial instrument 9 and a memory 10 for storing the quasi-peak measurement value. The output signal from the switch 4 may additionally be supplied to an average value measurement circuit 11 with an average value memory 12 connected to the output thereof. The outputs of the measurement circuits 5, 6, 7, 12 are through a change-over means 13 to an analog-to-connected digital converter 14, the digitalized output signals are evaluated in a microprocessor 15 and stored in a digital mapped memory 16 and may be displayed on a display unit 17.

The bandwidth of the band-pass filter 2 is selected in conformity with the predetermined bandwidth of the quasi-peak measuring circuit 7, and this band-pass filter determines the rise and fall time of the IF signal applied to the input. The microprocessor 15 stores therein the limit values specified by the standard for the peak voltage measurement and the quasi-peak measurement and, if applicable, also for the average value measurement.

Figure 2:
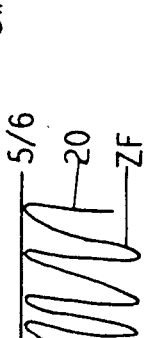
FIG. 2 is a graphic illustration of a continuous signal in the intermediate frequency range in which the signal peaks have the same value.
Figure 3:
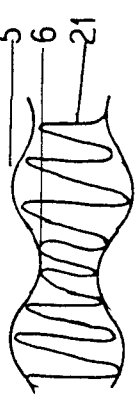
FIG. 3 is a graphic illustration of a modulated signal having maximum and minimum peak values.
Figure 4:
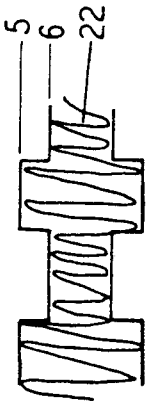
FIG. 4 is a schematic representation of a pulse-type modulated signal having maximum and minimum peak levels.

For measuring the RFI voltage of an EUT, the RF receiver 1 is tuned in the predetermined frequency range of for example 0.15 to 30 MHz, while the maximum and the minimum peak voltage levels are simultaneously measured by the maximum peak voltmeter 5 and the minimum peak voltmeter, respectively. As soon as the microprocessor 15 decides that a signal measured by the maximum peak voltmeter 5 exceeds the broadband limit preset for this frequency by the standard, the tuning operation of the receiver is interrupted. When it is subsequently decided that the maximum and the minimum peak voltage levels are equal, this indicates that a continuous signal 20 (FIG. 2) of non-varying amplitude is concerned and that therefore the EUT is a narrow-band noise. In that case, quasi-peak measurement is unnecessary in most cases But when it is found that maximum and minimum peak voltage levels have different magnitude so that the noise is a modulated signal 21 (FIG. 3) or, for instance, a pulse-like fluctuating signal 22 (FIG. 4), this indicates that broadband noise is concerned. In this case it is possible to determine by means of the subsequent quasi-peak measurement whether the EUT must be rejected as noise, because it is only when the measured value of the quasi-peak measurement also exceeds the predetermined limit value that a decision can be made that the test item does not satisfy the requirements of the standard.

In order to keep the read phase for reading out the measuring results from the quasi-peak measurement circuit 8 free from level variations, the additional switch 4 is provided which during the read phase is opened by a corresponding control signal 18. When the measuring results have been read from the memory 10 of the quasi-peak measuring circuit 7 and provided to the analog-to-digital converter 14 and the microprocessor 15, all memories of the measuring circuits 5, 6, 7 and 12 will be cleared by a corresponding clear signal 19 and will then be ready for another measuring operation.

Figure 5:
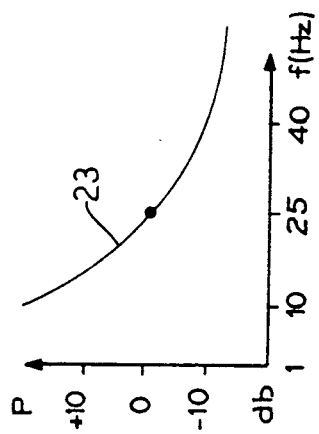
FIG. 5 is a graphic illustration of the standard characteristic of a measuring circuit for quasi-peak measurement as may be employed in practicing the present invention.

When it is not only required to sort out EUT's which are not free from interference but when information is simultaneously required as to the level of the repetition frequency of the main component of the amplitude modulation of the interference signal, this can additionally be determined by the quasi-peak measurement in the measuring circuit 7. From the standardized characteristic 23 of the measuring circuit 7 for quasi-peak measurement as shown in FIG. 5 it is possible to determine the level f of the rated interference signal by way of the magnitude of the output level p (known from CISPR 16, 1987, p. 196). Therefore an average repetition frequency of the interference signal is additionally available as a result in the microprocessor for further evaluation. If necessary, it is also possible to additionally measure the average value of the interference signal and to compare it in the microprocessor 15 with the related standardized limit values, and these values will then also be available in the mapped memory 16 for further evaluation.

After tuning of the entire measuring range it is thus possible, for instance, to display on the screen together with the usual overall spectrum 24 the frequency of all of the signals 25 which have exceeded the predetermined limit level also in the quasi-peak measurement, and it is also possible additionally to display the related variation frequencies of these interference signals, or the user may fetch them from the memory 16 as necessary.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A method of measuring RFI voltages in a predetermined frequency range, comprising the steps of:
    tuning the frequency range of a receiver and, during tuning of the frequency range, measuring the maximum and minimum peak voltage levels;
    comparing the measured maximum peak voltage level with a predetermined limit value and interrupting tuning when the limit value is exceeded;
    comparing the maximum peak voltage level with the minimum peak voltage level; and
    evaluating the result of the comparison of the maximum peak voltage level with the minimum peak voltage level by deciding in dependence of this comparison whether or not an additional quasi-peak measurement shall be performed and evaluated at the instantaneous frequency of interruption.

2. The method of claim 1, and further defined as:
    with the tuning process interrupt, performing the quasi-peak measurement only when the maximum and minimum peak voltage levels are different.

3. The method of claim 1, and further defined as:
    determining the repetition frequency of the interference signal from the result of quasi-peak measurement.

4. The method of claim 1, and further defined as:
    with the tuning process interrupted, measuring the average level of the interference voltage.

* * * * *